(12) United States Patent
Park et al.

(10) Patent No.: US 7,074,670 B2
(45) Date of Patent: Jul. 11, 2006

(54) METHOD OF FORMING STORAGE NODE OF CAPACITOR IN SEMICONDUCTOR MEMORY, AND STRUCTURE THEREFORE

(75) Inventors: Je-Min Park, Gyeonggi-do (KR); Doo-Sup Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/871,322

(22) Filed: Jun. 18, 2004

(65) Prior Publication Data
US 2005/0032304 A1 Feb. 10, 2005

(30) Foreign Application Priority Data
Jun. 19, 2003 (KR) ............. 10-2003-0039786

(51) Int. Cl.
*H01L 21/8242* (2006.01)

(52) U.S. Cl. .............. 438/253; 438/254; 438/396
(58) Field of Classification Search ....... 438/238–240, 438/256–259, 396–399
See application file for complete search history.

(56) References Cited

U.S. PATENT DOCUMENTS

| 6,107,155 A | 8/2000 | Hsiao et al. |
| 6,228,736 B1 * | 5/2001 | Lee et al. ............. 438/396 |
| 6,342,419 B1 | 1/2002 | Tu |
| 6,472,268 B1 | 10/2002 | Yoo |
| 6,730,956 B1 * | 5/2004 | Bae et al. ............. 257/306 |
| 6,770,528 B1 * | 8/2004 | Furukawa et al. ...... 438/244 |

\* cited by examiner

*Primary Examiner*—H. Jey Tsai
(74) *Attorney, Agent, or Firm*—Marger Johnson & McCollom, P.C.

(57) ABSTRACT

In one embodiment, an etch stop layer and a mold layer is sequentially formed on a semiconductor substrate having an interlayer insulation layer. The interlayer insulation layer includes a conductive region formed therein. The mold layer is partially etched to expose a top surface of the etching stop layer. The exposed etching stop layer and an upper portion of the interlayer insulating layer are removed to form a first aperture part that exposes a portion of the conductive region. The conductive region exposed in the first aperture part is etched to form a second aperture part. A conductive layer for the capacitor storage node is deposited on the semiconductor substrate having the first and second aperture parts. The conductive layer provided on the mold layer is planarized to form separated capacitor storage nodes.

42 Claims, 13 Drawing Sheets

METHOD OF FORMING STORAGE NODE OF CAPACITOR IN SEMICONDUCTOR MEMORY, AND STRUCTURE THEREFORE

CROSS REFERENCE TO RELATED APPLICATIONS

This application claims priority from Korean Patent Application No. 2003-39786, filed on Jun. 19, 2003, the contents of which are incorporated herein by reference in their entirety.

BACKGROUND OF THE INVENTION

1. Field of the Invention

The present invention relates to semiconductor devices, and more particularly, to a method of forming a storage node of capacitor in a semiconductor memory such as a DRAM (Dynamic Random Access Memory) and a structure thereof.

2. Description of the Related Art

A memory cell of DRAM is generally constructed of one access transistor and one storage capacitor. The capacitor is largely classified as a laminated type or a trench type depending on its formed position on a semiconductor substrate.

Semiconductor manufacturers for manufacturing a semiconductor memory that employs the laminated-type capacitor have continuously researched producing capacitors with a higher capacitance in a limited area in conformity with various requirements of semiconductor users. The need for this continuous research is derived from the high integration of memory cells that produces a tightened critical dimension which results in low capacitance of the memory cells. However, in order to guarantee a refresh operating period within a range of regulated value, the capacitance must instead be increased.

Capacitors are generally composed of a storage node as a lower electrode node and a plate node as an upper electrode. High integration causes the bottom critical dimension (CD) of the storage node to be too small which causes a leaning phenomenon resulting in the collapse of the storage node.

To prevent the leaning phenomenon, two methods have widely been used in this field. First is the method of increasing the bottom CD of straight type storage node. Second is the a method of lowering the height of storage node. However, the straight type method is undesirable because it is difficult to increase the bottom CD after a design rule was first decided, and the latter method is undesirable because it is unlikely to obtain the desired capacitance.

The former method was recently improved to provide a larger bottom CD and reduce the occurrence rate of the leaning phenomenon within a limited area. In this improved method, and in forming the storage node of the capacitor, an active region, a gate, a bit line contact, a storage node contact or buried contact, and bit line patterns are formed in a diagonal direction slightly slanted as compared with the existing straight structure, and thereon, the capacitor storage node is formed. This improved method significantly increases the bottom CD of the storage node as compared with the storage node of the existing straight type, and this is known in this field as a diagonal structure. However, this diagonal structure has severely complicated manufacturing processes in forming the storage node.

To avoid the complicated manufacturing processes of the diagonal structure, a new method for forming a storage node of square type was recently developed which shared advantages of the straight structure and the diagonal structure. In this method for the square type, an active region, a gate, a bit line and a capacitor storage node contact etc. are formed by the existing straight structure. Then, entirely thereon, a buffer layer is formed, and a contact is formed in the buffer layer, to thus connect the capacitor storage node of square type with a capacitor storage node contact of the straight structure. This new method has been regarded as increasing the storage node of the square type so that the bottom CD of the capacitor storage node is largely increased to about twice that of the storage node of the straight type based on the straight structure.

The method of manufacturing the storage node of square type in the prior art will be described referring to FIGS. 1 through 6, as follows, only to provide a thorough understanding of the present invention to be described later.

FIG. 1 is a plan view illustrating a disposed relationship for storage nodes of capacitor based on a square type in a semiconductor memory according to an example of the prior art. FIGS. 2 to 6 are sectional views showing sequential processes in manufacturing the storage node referred to FIG. 1.

Referring first to FIG. 1, vertically on the drawing, six word line patterns 13 as gates of a plurality of access transistors are formed, and horizontally on the drawing, four bit line patterns 16 connected to drains of the access transistors are formed. Storage nodes 23 of square type of the capacitors form an oblong structure in a diagonal direction to the bit line patterns 16 and the word line patterns 13. Herewith, each contact 17 of the storage node of capacitor and its lower structure are formed by a straight structure as the afore-mentioned. A reference number 14 indicates a bit line contact for connecting a bit line with a drain, and 14a designates a bit line pad. FIGS. 2 to 6 are sectional views taken along A–A' and B–B' cutting lines shown in FIG. 1.

On the left drawings of FIGS. 2 through 6, cross-sectional views taken along A–A' cutting line direction of FIG. 1, namely, the direction of a word line connected to a gate of access transistor, are illustrated per process. On the right drawings of FIGS. 2 to 6, cross-sectional views taken along B–B' cutting line direction of FIG. 1, namely, the direction of a bit line connected to a drain of the access transistor, are illustrated per process.

FIG. 2 illustrates a structure before forming a storage node of capacitor having a square type in a DRAM based on a capacitor over bitline (COB) structure. A device separate layer 3 is formed on a determined region of a semiconductor substrate 11 to define a plurality of active regions. A gate oxide layer 5 is formed on the active regions. Thereon, a plurality of parallel word line patterns 13 traversing the active regions are formed. The word line pattern 13 contains a word line 7b and a capping layer pattern 7c laminated sequentially. An impurity ion is implanted into the active regions by using the word line pattern 13 and the device separate layer 3 as an ion implantation mask, to form impurity regions 4s, 4d. The active impurity regions 4d between one pair of word line patterns 13 traversing the respective active regions are pertinent to a common drain region of a DRAM cell transistor. Further, the impurity region 4s formed on both sides of each common drain region 4d is pertinent to a source region of the DRAM cell transistor. A word line spacer 7a is formed on a sidewall of the gate oxide layer 5 and the word line patterns 13. A first interlayer insulation layer 13a is formed on an entire face of the semiconductor substrate containing the word line spacer 7a. The first interlayer insulation layer 13a is etched by using an etch mask pattern, to form the bit line pad 14a connected with the common drain region 4d and a capacitor storage node pad 12 connected with the source region 4s. Then, a second interlayer insulation layer 16a is formed on an entire face of the semiconductor substrate containing the bit line pad 14a and the capacitor storage node pad 12. The second interlayer insulation layer 16a is patterned to form the bit line contact 14 referred to FIG. 1. Then, the bitline contact 14 is connected with the plurality of bit line patterns 16 having a sidewall spacer 15. The bit line patterns 16 are formed, involving a bit line 16b and a bit line capping layer pattern 16c each laminated sequentially and traversing the word line patterns 13. Each bit line 16b is electrically connected to the bit line pad 14a through the bit line contact 14. A third interlayer insulation layer 15a is formed on an entire face of the semiconductor substrate containing the bit line spacer 15. The third interlayer insulation layer 15a and the second interlayer insulation layer 16a are continuously patterned to form a capacitor storage node contact 17.

The lower structure of semiconductor substrate composed of the active region 4s, 4d, the bitline contact 14, the capacitor storage node pad 12, the bitline pattern 16, the word line pattern 13 and the capacitor storage node contact 17 etc., is formed by the straight structure.

Referring to FIG. 3, a buffer layer 18 is formed on the semiconductor substrate 11 having the capacitor storage node contact 17. An aperture for connecting the storage node of square type with the capacitor storage node contact 17 is formed through a photolithography and etching process. Metallic material such as tungsten etc. is deposited in the aperture and then a flattening is performed to form a pad contact 19.

Referring to FIG. 4, film material such as silicon nitride layer etc. is deposited to form an etching stop layer 20 on the semiconductor substrate having the pad contact 19. Thereon, a mold oxide layer 21 for a formation of the storage node of capacitor is formed by a thick thickness.

In FIG. 5, an etching mask pattern is formed in the mold oxide layer 21, and an aperture part 22 is formed to expose an upper part of the pad contact 19 connected with the storage node of the capacitor, through an etching process.

In FIG. 6, a chemical vapor deposition(CVD) process is performed on an entire face of the semiconductor substrate having the aperture part 22, to form a conductive layer 23 of polysilicon etc. The conductive layer remained on an upper part of the mold oxide layer is removed through a process such as a flattening etc., to form the capacitor storage node of square type. The capacitor storage node 23a through 23e of square type provides a sectional face of the storage node of the capacitor based on the square type referred to FIG. 1.

In the prior art described above, in order to form a capacitor storage node of square type on a semiconductor substrate based on a conventional straight lower structure, a buffer layer is adapted. Thus, there is a problem of an additional step of forming a pad contact on the buffer layer, the pad contact being for connecting the storage node of square type with a storage node contact of straight structure.

SUMMARY OF THE INVENTION

In one embodiment, an etch stop layer and a mold layer is sequentially formed on a semiconductor substrate having an interlayer insulation layer. The interlayer insulation layer includes a conductive region formed therein. The mold layer is partially etched to expose a top surface of the etching stop layer. The exposed etching stop layer and an upper portion of the interlayer insulating layer are removed to form a first aperture part that exposes a portion of the conductive region.

The conductive region exposed in the first aperture part is etched to form a second aperture part. A conductive layer for the capacitor storage node is deposited on the semiconductor substrate having the first and second aperture parts. The conductive layer provided on the mold layer is planarized to form separated capacitor storage nodes.

BRIEF DESCRIPTION OF THE DRAWINGS

The above and other features of exemplary embodiments of the present invention will become readily apparent from the description of the exemplary embodiment that follows, Referring to the attached drawings in which.

DETAILED DESCRIPTION OF PREFERRED EMBODIMENTS

It will be understood by those skilled in the art that the present invention can be embodied by numerous different types and is not limited to the following described embodiments. The following various embodiments are exemplary in nature.

Figure 1:
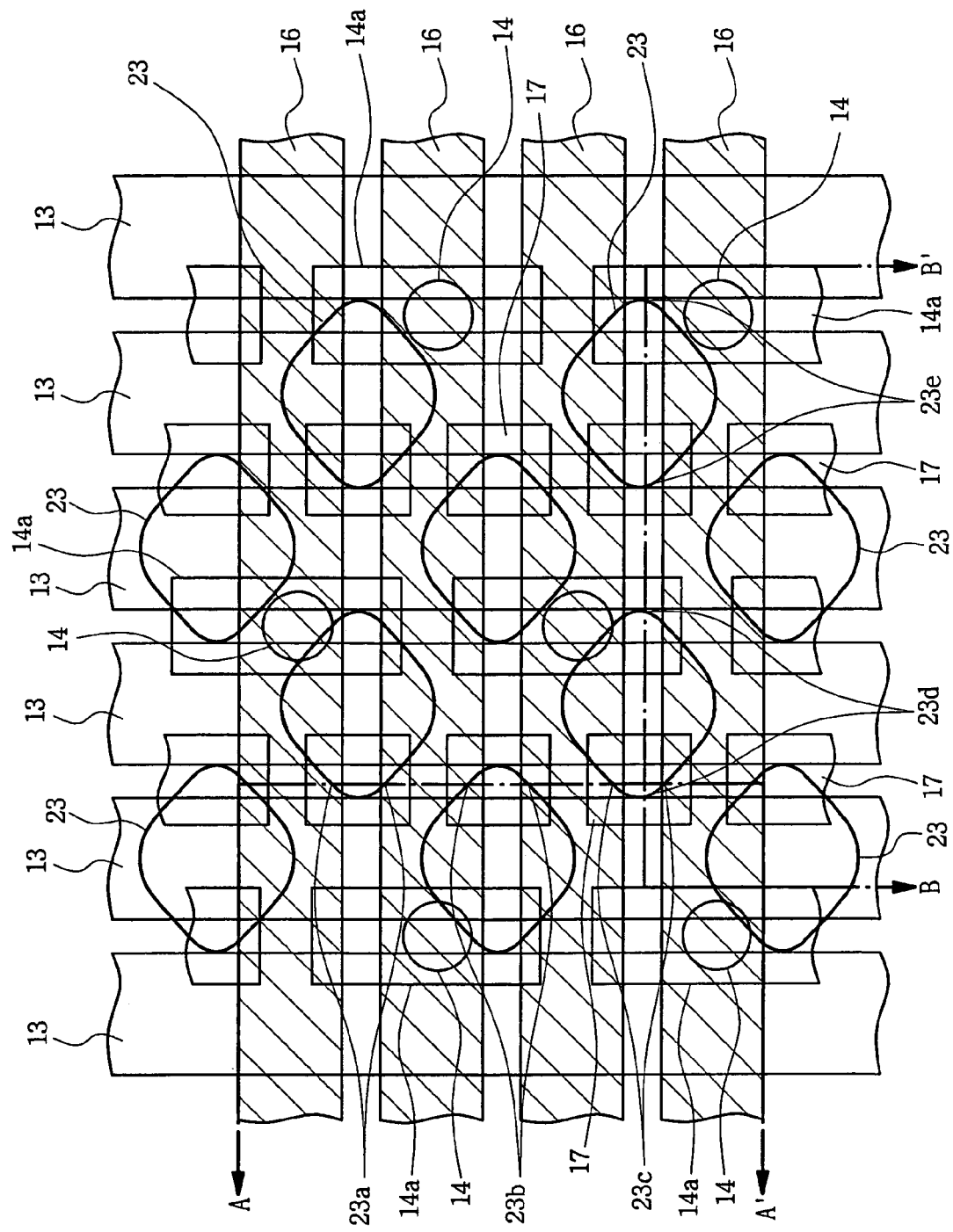
FIG. 1 is a plan view illustrating a disposed relationship of storage nodes of capacitors based on a square type in a semiconductor memory according to the prior art.
Figure 2:
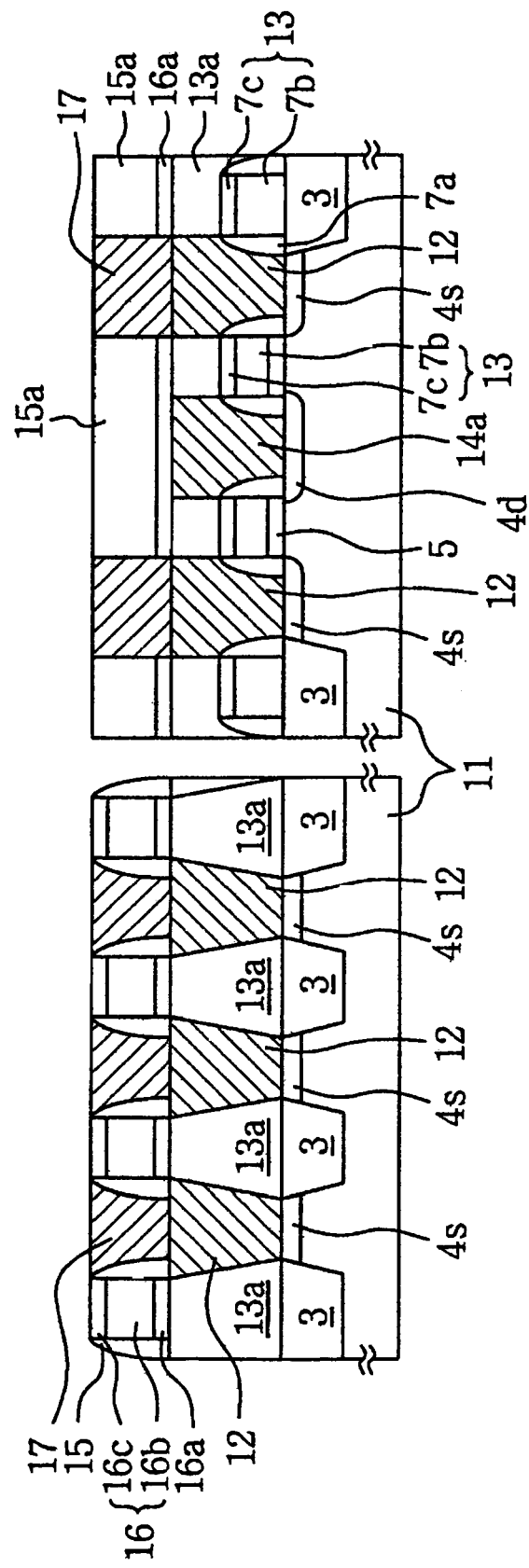
FIGS. 2 through 6 are cross-sectional views of sequential processes for manufacturing the storage node referred to FIG. 1.
Figure 3:
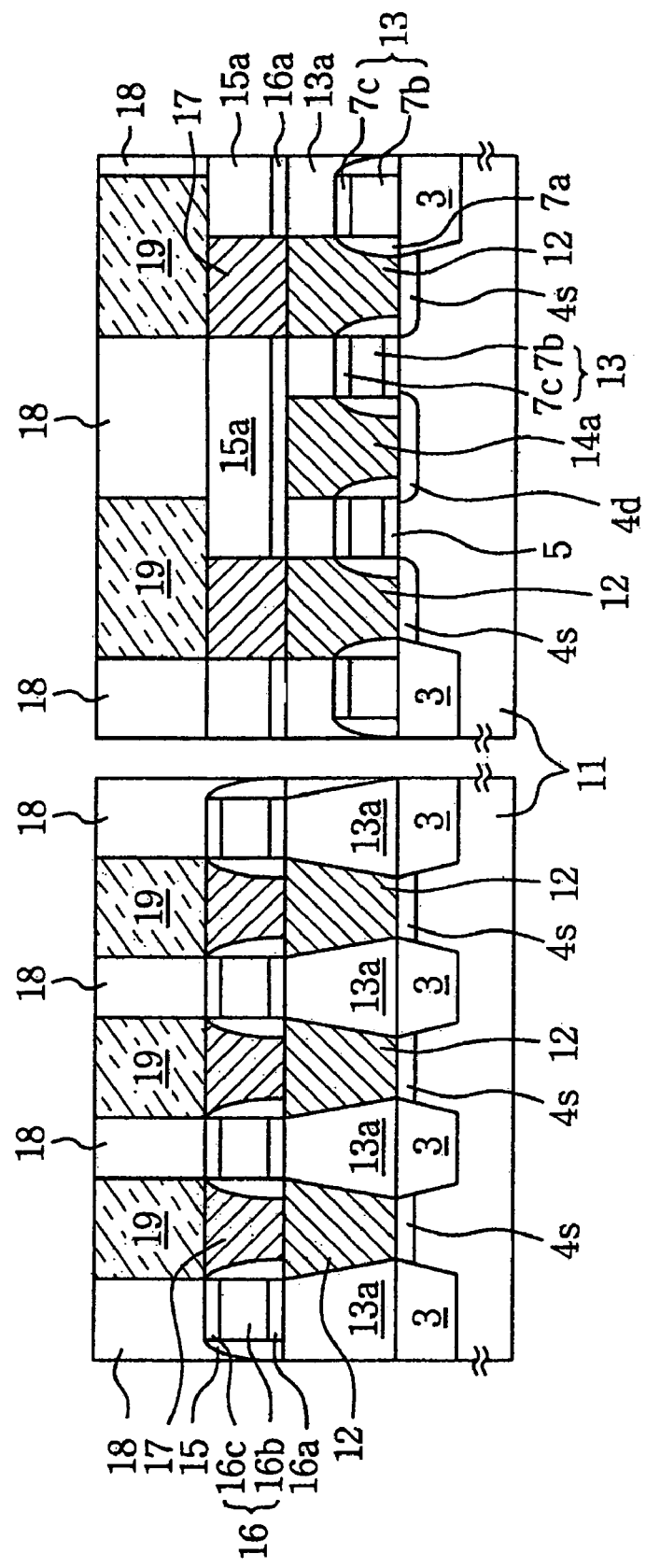
Figure 4:
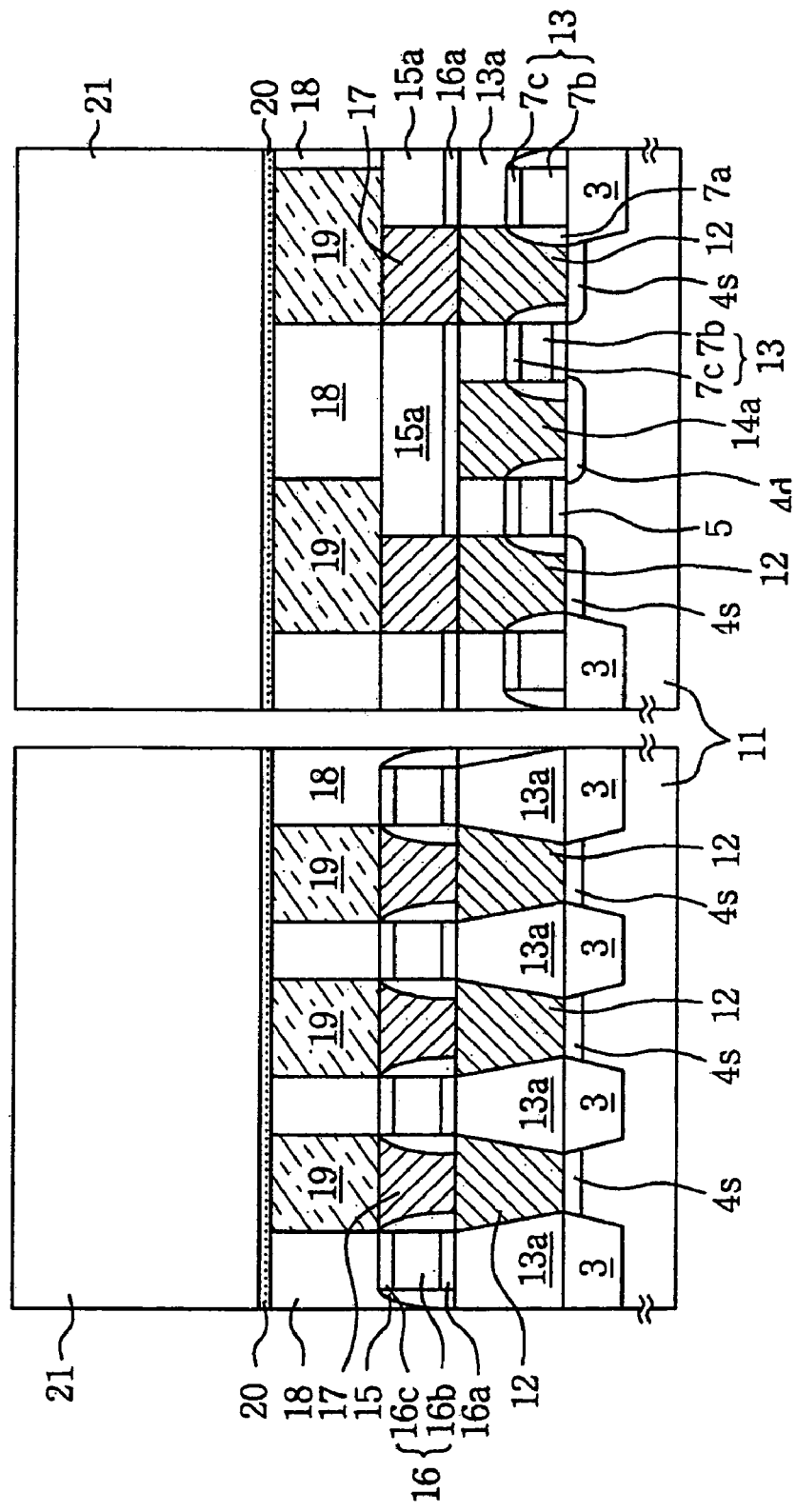
Figure 5:
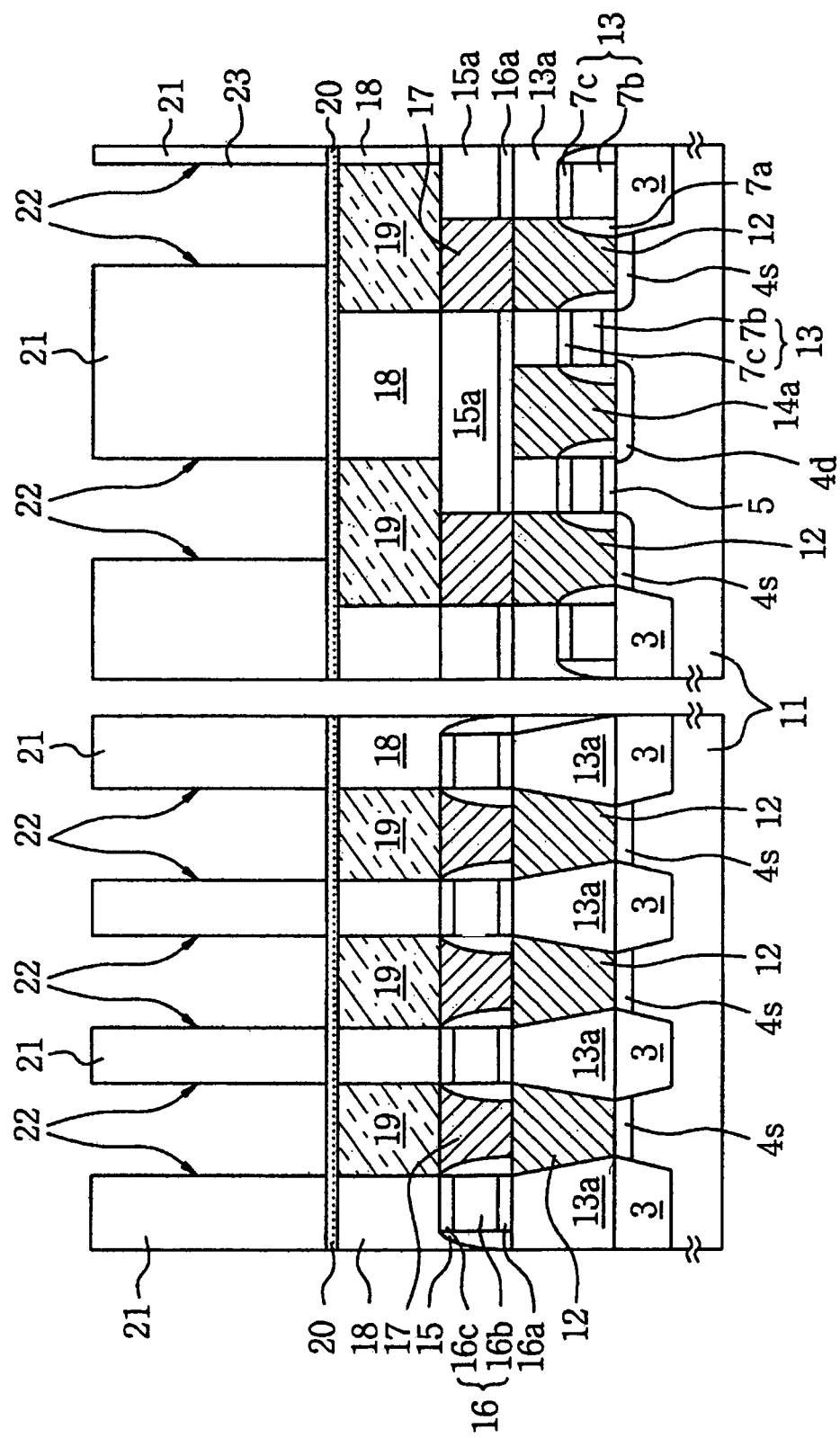
Figure 6:
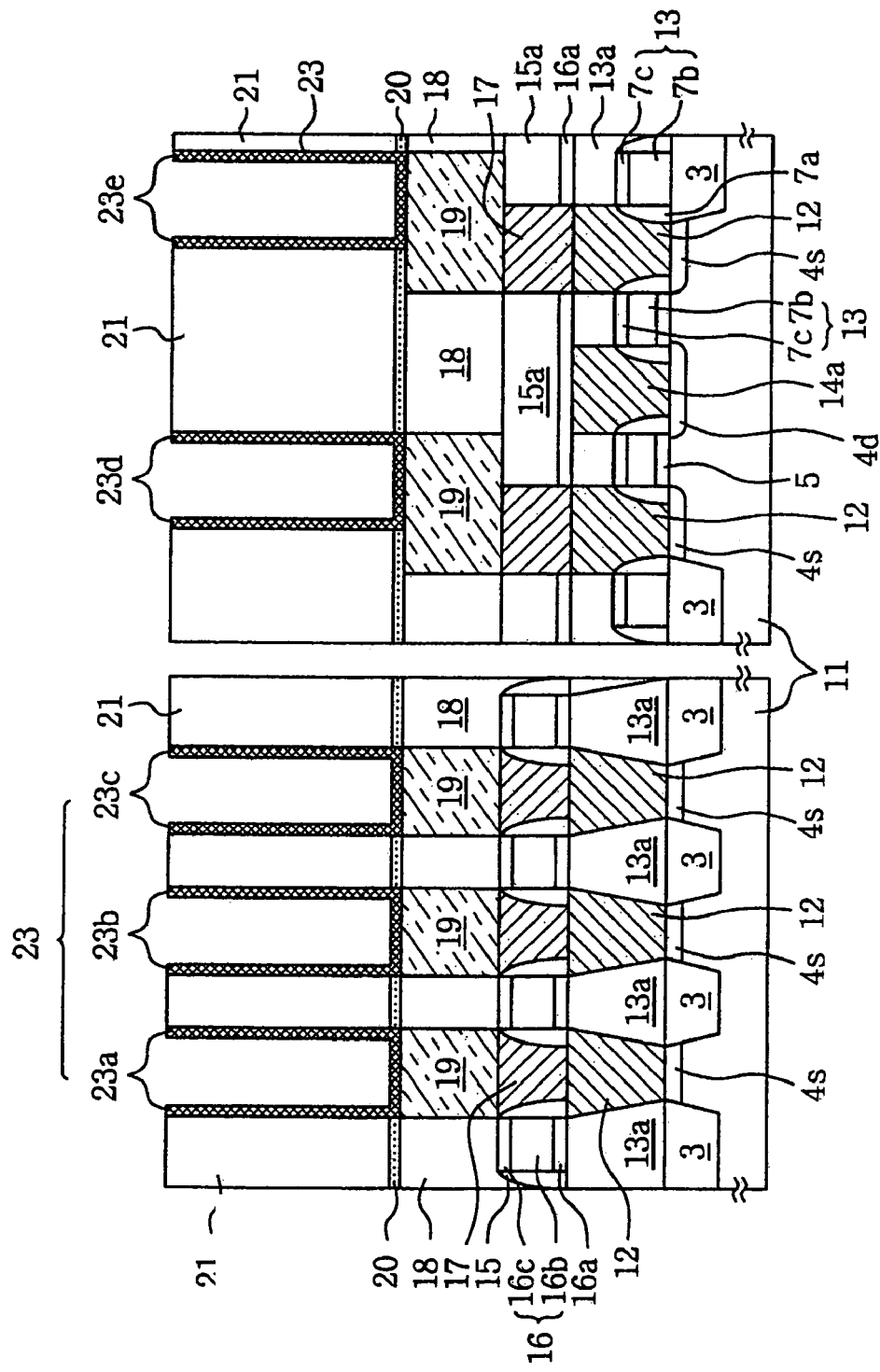
Figure 7:
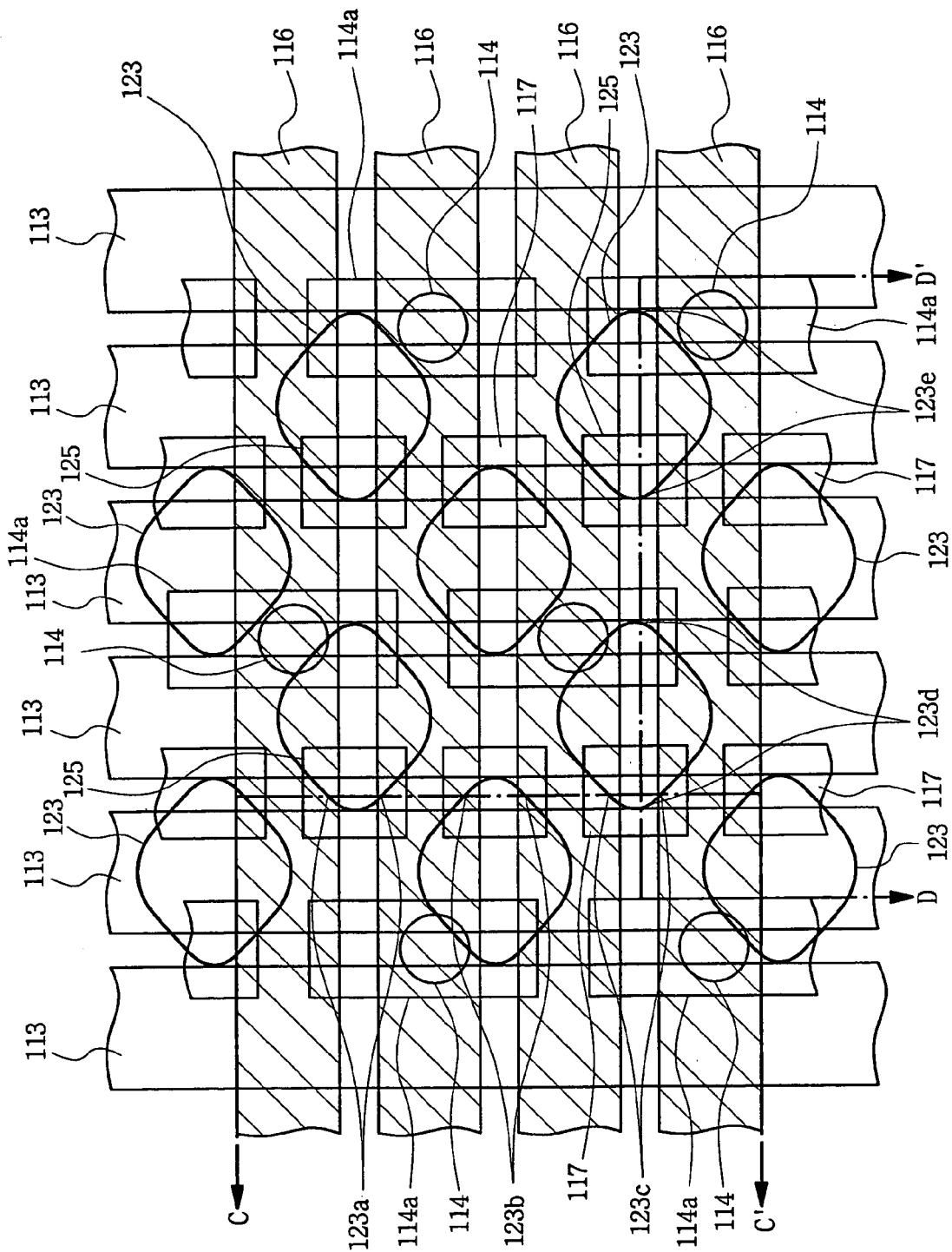
FIG. 7 is a plan view illustrating a disposed relationship of storage nodes of capacitors based on a square type in a semiconductor memory according to an exemplary embodiment of the present invention.

FIG. 7 is a plan view showing a capacitor storage nodes of a square type in a semiconductor memory according to an exemplary embodiment of the present invention. FIGS. 8 through 13 are cross-sectional views of sequential processes for manufacturing the storage node referred to in FIG. 7.

Referring to FIG. 7, vertically on the drawing, six word line patterns 113 as gates of a plurality of access transistors are formed, and horizontally on the drawing, four bit line patterns 116 connected to drains of the access transistors are formed. Storage nodes 123 of the capacitors based on a square type form an oblong structure in a diagonal direction to the bit lines 116 and the word lines 113. Herewith, a storage node contact 117 of each capacitor storage node, an interlayer insulation layer and its below structure are formed by a straight structure as the afore-mentioned. The capacitor storage node 123 is in contact with an inner face of an aperture part 125 that is formed at a portion of the storage node contact 117 based on the straight structure, to be thus electrically connected to the storage node contact 117. A reference number 114 indicates a bit line contact for connecting a bit line with a drain, and 114a designates a bit line pad. FIGS. 8 to 13 are cross-sectional views taken along C–C' and D–D' cutting lines referred to FIG. 7.

On the left drawings of FIGS. 8 through 13, cross-sectional views taken along line C–C' of FIG. 7, namely, a direction of a word line connected to a gate of access transistor, are illustrated per process. On the right drawings of FIGS. 8 to 13, cross-sectional views taken along line D–D' of FIG. 7, namely, a direction of a bit line connected to a drain of the access transistor, are illustrated per process.

Figure 8:
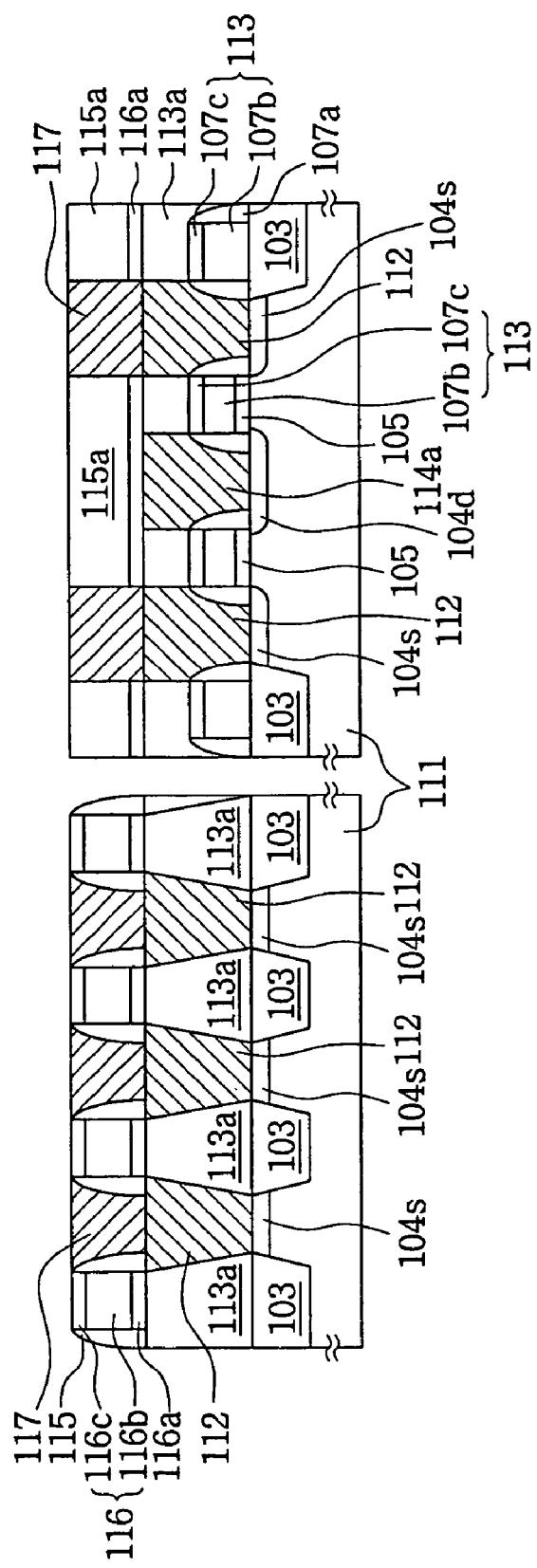
FIGS. 8 through 13 are cross-sectional views of sequential processes for a manufacturing of the storage node referred to FIG. 7.

FIG. 8 illustrates a structure before forming a storage node of capacitor having a square type in a DRAM based on a capacitor over bitline (COB) structure. A device separate layer 103 is formed on a determined region of a semiconductor substrate 111 to define a plurality of active regions. A gate oxide layer 105 is formed on the active regions. Thereon, a conductive layer and a word line capping layer are formed sequentially. The conductive layer is formed of polysilicon layer or metallic polycide layer. The word line capping layer can be desirably formed of silicon nitride layer. The word line capping layer and the conductive layer are continuously patterned to form a plurality of parallel word line patterns 113 traversing the active regions. The word line pattern 113 contains a word line 107b and a capping layer pattern 107c laminated sequentially. An impurity ion is implanted into the active regions by using the word line patterns 113 and the device separate layer 103 as an ion implantation mask, to form impurity regions 104s, 104d. The active impurity regions 104d between one pair of word line patterns 113 traversing the respective active regions are pertinent to a common drain region of a DRAM cell transistor. Further, the impurity regions 104s formed on both sides of the common drain region 104d are pertinent to a source region of the DRAM cell transistor. A word line spacer 107a is formed on a sidewall of the gate oxide layer 105 and the word line patterns 113 through a general method. The word line spacer 107a can be desirably formed of material layer same as the word line capping layer pattern 107c. A first interlayer insulation layer 113a is formed on an entire face of the semiconductor substrate containing the word line spacer 107a. The first interlayer insulation layer 113a is etched by using an etch mask pattern, to form the bit line pad 114a connected with the common drain region 104d and a capacitor storage node pad 112 connected with the source region 104s. Then, a second interlayer insulation layer 116a is formed on an entire face of the semiconductor substrate containing the bit line pad 114a and the capacitor storage node pad 112. The second interlayer insulation layer 116a is patterned to form the bit line contact 114 referred to FIG. 7. Then, the plurality of bit line patterns 116 having a sidewall spacer 115 are formed being connected with the bitline contact 114. The bit line patterns 116 are formed traversing the word line patterns 113. The bit line pattern 116 involves a bit line 116b and a bit line capping layer pattern 116c laminated sequentially. The bitline 116b is formed of a conductive layer such as a tungsten layer or tungsten polycide layer, and the bitline capping layer pattern 116c is formed of silicon nitride layer. The bitline spacer 115 is formed at a sidewall of the bitline 116b. The bitline spacer 115 is formed of a nitride layer having an etch selection rate for silicon oxide. Each bitline 116b is electrically connected to the bit line pad 114a through the bit line contact 114. A third interlayer insulation layer 115a is formed on an entire face of the semiconductor substrate containing the bit line spacer 115. The third interlayer insulation layer 115a and the second interlayer insulation layer 116a are continuously patterned to form the capacitor storage node contact 117. The capacitor storage node contact 117 may be formed of polysilicon.

The lower structure of semiconductor substrate constructed of the active regions 104s, 104d, the bitline contact 114, the capacitor storage node pad 112, the bitline pattern 116, the word line pattern 113 and the capacitor storage node contact 117 may be formed by the straight structure.

Figure 9:
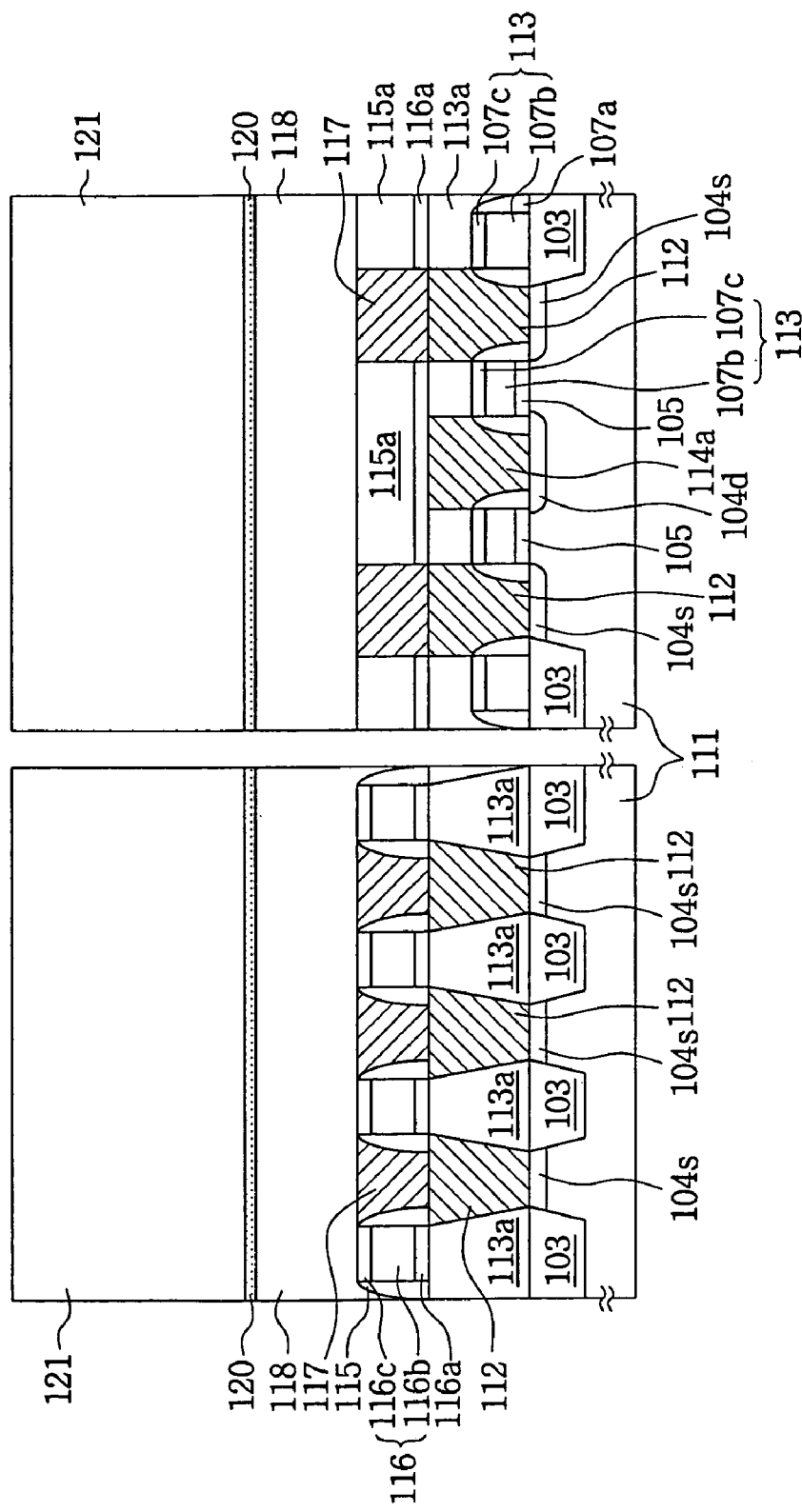

Referring to FIG. 9, a buffer layer 118 made of PE-TEOS (Plasma Enhanced Tetra Ethyl Ortho Silicate) is formed on the semiconductor substrate having the capacitor storage node contact 117. The buffer layer 118 can be formed to prevent the structure below the buffer layer from being damaged. Subsequently, an etching stop layer 120 is formed on the buffer layer 118. Then, a mold oxide layer 121 having a high etch selection rate as compared with the etching stop layer is formed. The etching stop layer 120 can be formed of silicon nitride layer if the mold oxide layer 121 is made of PE-TEOS material.

That is, the mold oxide layer 121, on which a capacitor storage node of square type will be formed, e.g., a single layer of PE-TEOS or a multilayer containing the PE-TEOS layer, is formed thick.

Figure 10:
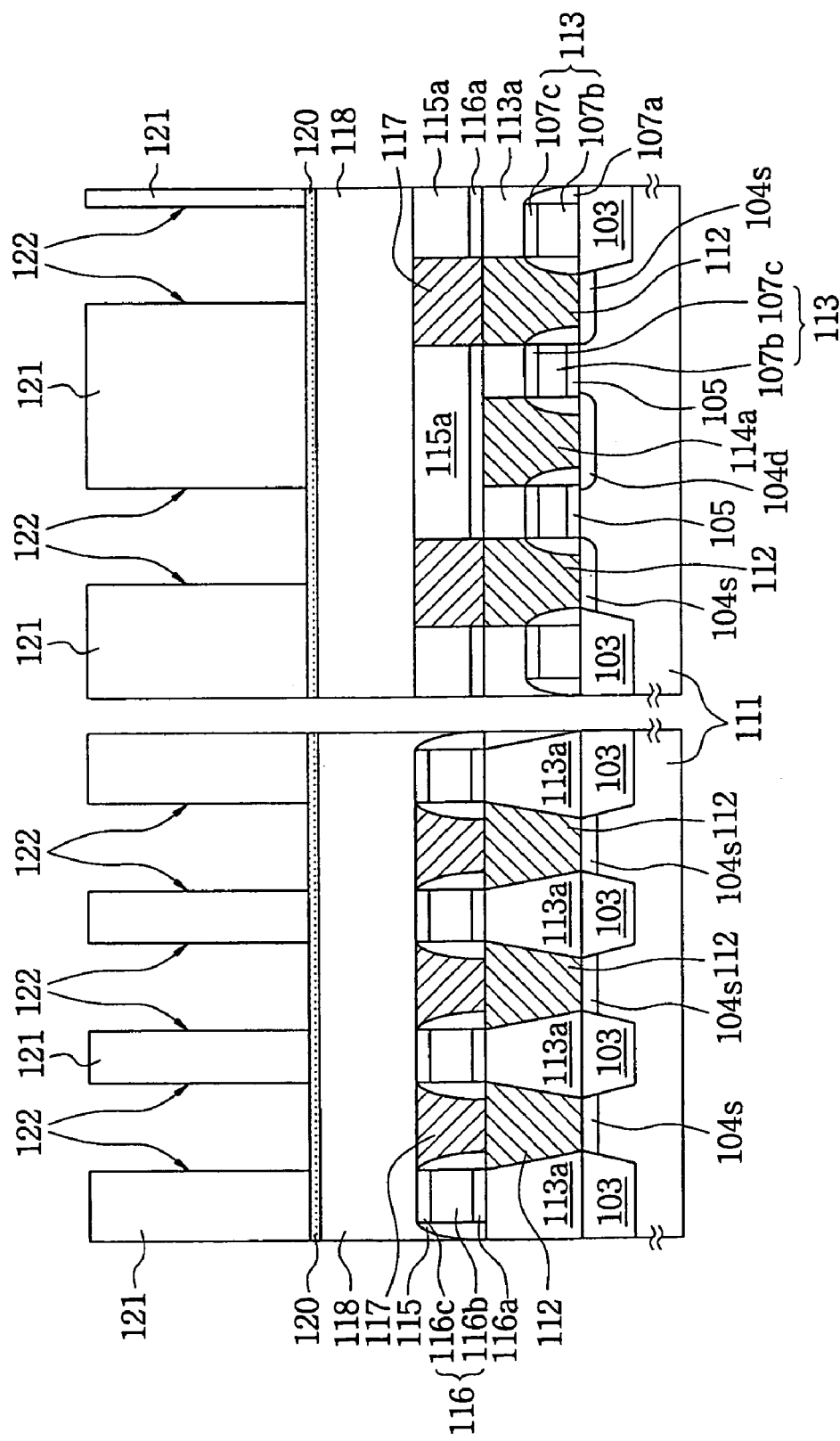

FIG. 10 illustrates a process of forming a first aperture part 122, that is, after etching a portion of the mold oxide layer until a top surface of the etching stop layer is exposed, to be overlapped with an upper portion of the conductive region, by using an etch mask pattern (not shown) formed by, for example, a square type. To prevent an excessive etching, the etching is preferably stopped at the etching stop layer 120. The etch mask can be formed of polysilicon.

Figure 11:
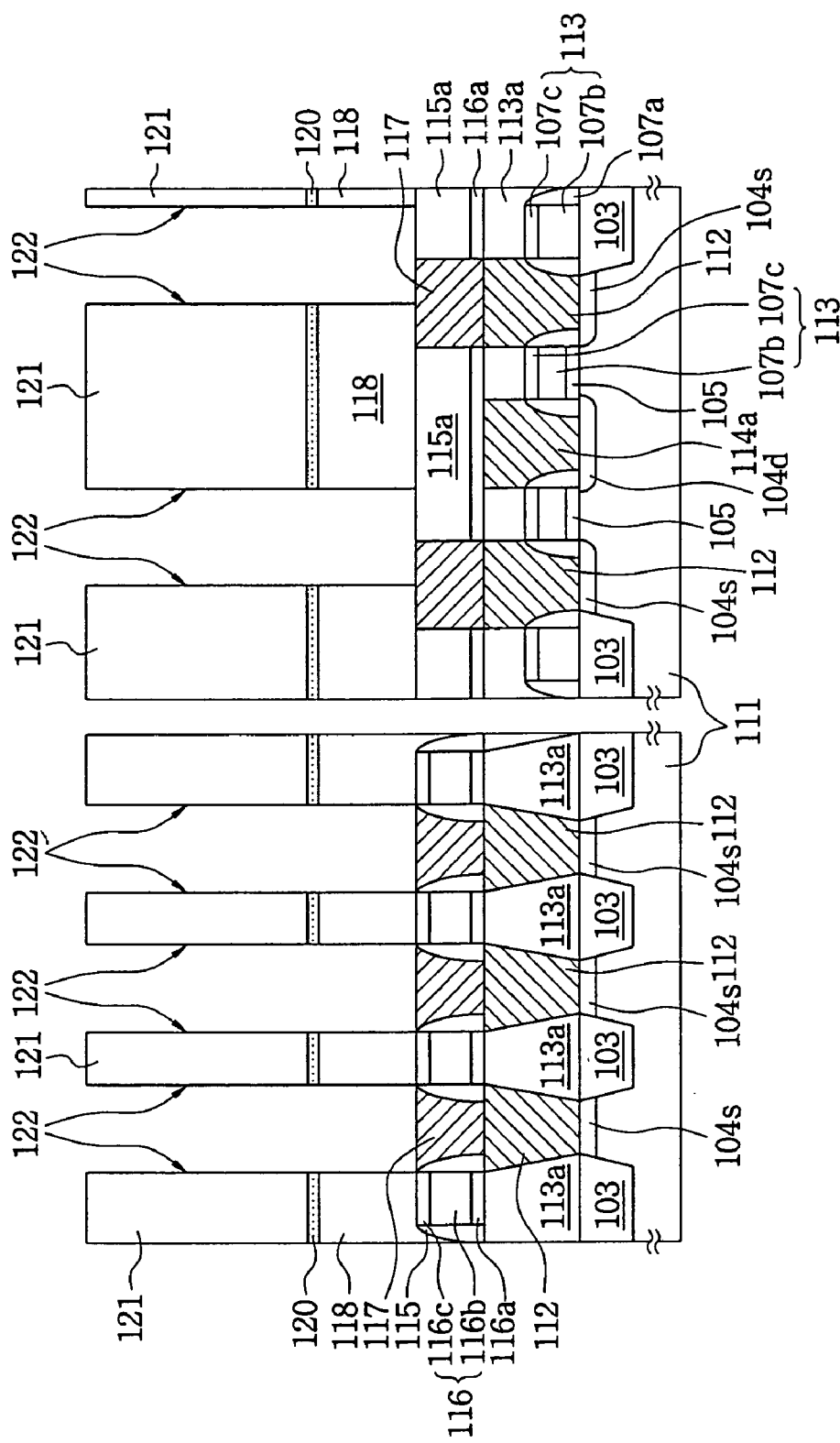

Referring to FIG. 11, after etching a portion of the mold oxide layer 121, the etching stop layer 120 is removed, and the buffer layer 118 is etched to form the first aperture part 122 for exposing the capacitor storage node contact 117. The conductive region 117 exposed in the first aperture part 122 is illustrated as the capacitor storage node contact 117 in the drawing. This conductive region may be in communication with a source region of the transistor.

Figure 12:
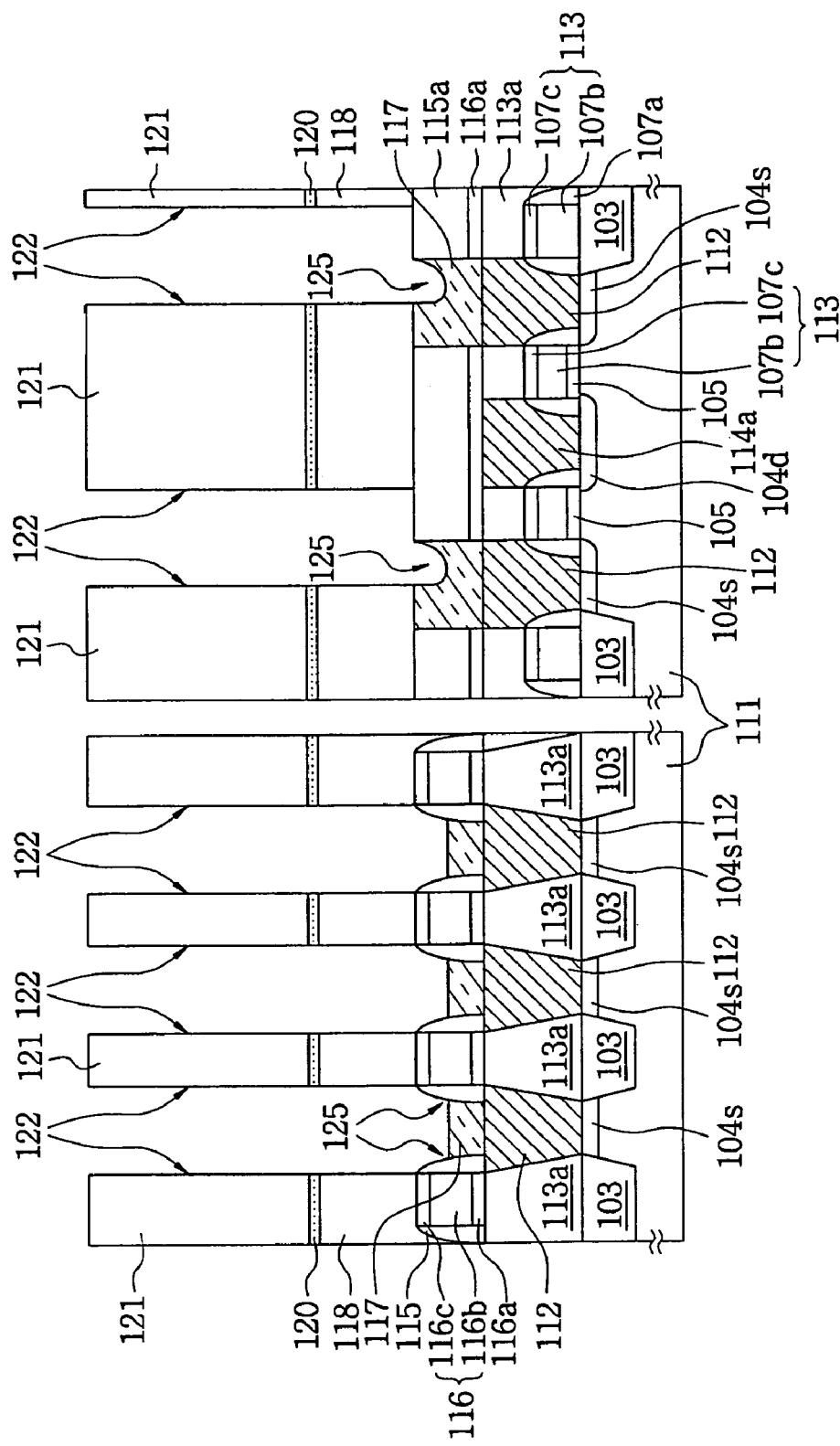

Referring to FIG. 12, the capacitor storage node contact 117 exposed in the first aperture part 122 is selectively etched, to form a second aperture part 125 in which the capacitor storage node 123 of square type will be formed. The second aperture part is formed by highly determining an etch selection rate for the mold oxide layer 121, the etching stop layer 120 and the bitline spacer 115 and by selectively dry etching only the capacitor storage node contact 117 exposed in the first aperture part 122. The etching process to form the second aperture part can be appropriately formed to a depth of about 100 Å through about 3000 Å. In addition, if the capacitor storage node contact is formed of polysilicon, and when the capacitor storage node contact 117 is etched to form the second aperture part 125, the polysilicon used as the etch mask when forming the first aperture part is removed together, thus eliminating the additional step of removing the etch mask when separating the capacitor storage node 123.

Figure 13:
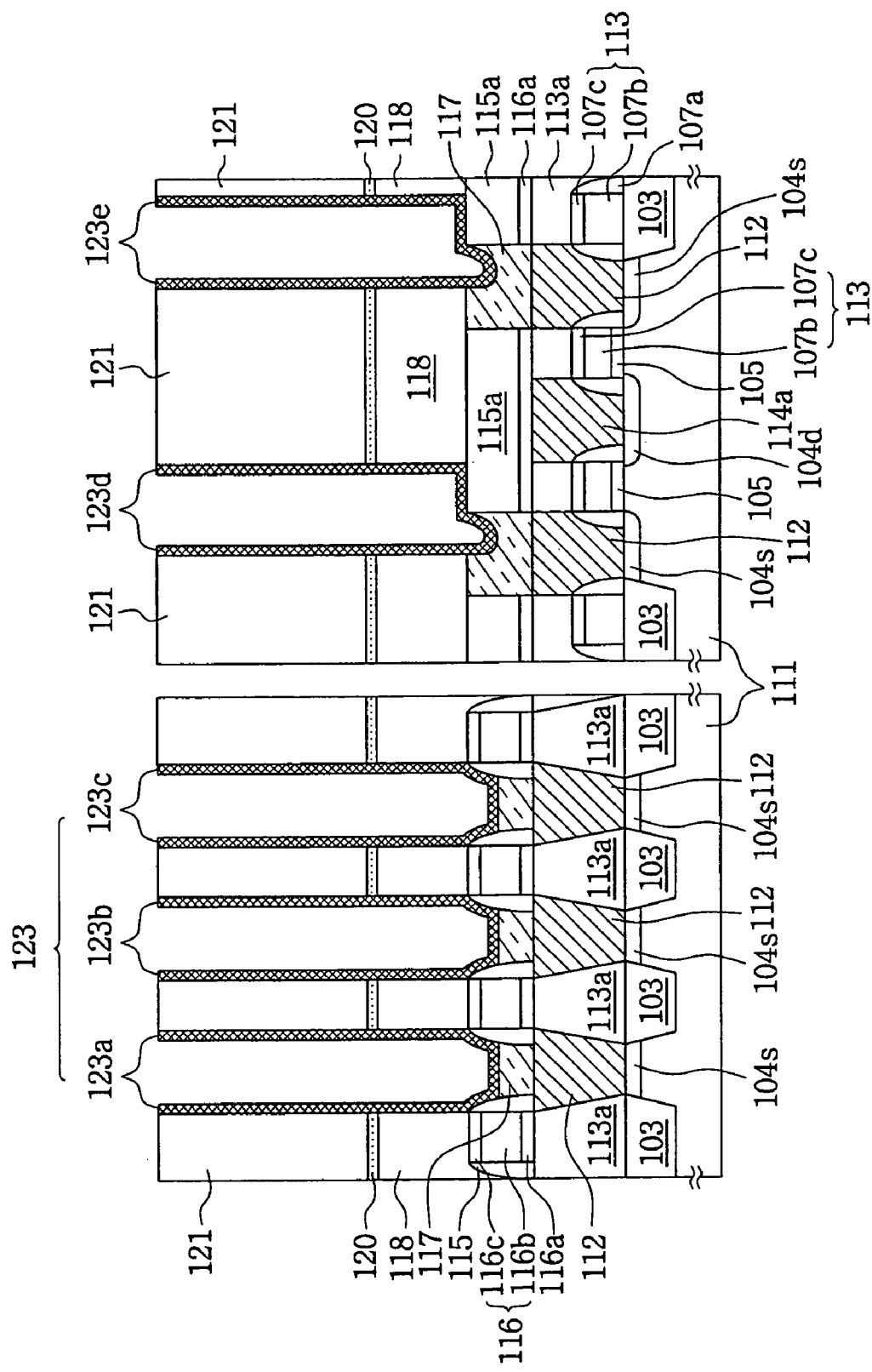

Referring to FIG. 13, a conductive layer for a formation of the capacitor storage node of square type is deposited on the semiconductor substrate having the first aperture part 122 and the second aperture part 125. The conductive layer is preferably formed of a material such as amorphous silicon or polysilicon through a conventional technique such as a CVD process. Further, a residual conductive layer on the mold oxide layer is removed by a planarization process to form the capacitor storage node of square type. The planarization process may be a CMP (Chemical and Mechanical Polishing) process or an etch back process, or can employ an anisotropic etching process. The capacitor storage nodes 123a to 123e referred to in FIG. 13 are cross-sectional views from the capacitor storage nodes 123a to 123e referred to FIG. 7. The capacitor storage node 123a to 123e is electrically contacted with a sidewall of the selectively etched storage node contact 117.

The capacitor storage node 123 of square type can be widely applied to a semiconductor memory device for a DRAM cell. Further, the capacitor storage node of square type can be formed by a box shape based on a solid stack structure, a cylinder type or a hemisphere(HSG) type, or others.

According to this embodiment of the present invention, the following advantages can be provided in forming a capacitor storage node of square type.

First, there is no need to perform a process of forming a contact through a buffer layer, as in the prior art where a precise photolithography and etching process is required in the process of forming the contact through use of the buffer layer. In addition, an etch mask and a storage node contact are formed of polysilicon, and in selectively etching the storage node contact, the etch mask is etched together, and thus the step of removing the etch mask in separating the capacitor storage node can be omitted. Therefore, the number of processes can be reduced.

Second, the capacitor storage node may be formed in such a way that a lower face of the storage node is contacted with an upper part of the etched conductive region, because of the recess at an edge portion of upper portion of the interlayer insulation layer. Thus, an area of the storage node is extended by the contacted area. As a result, capacitance can be increased.

Third, the capacitor storage node may be formed by a square type to increase a bottom critical dimension of the storage node, thus reducing the leaning phenomenon.

Fourth, the capacitor storage node is formed being contacted with a sidewall through an aperture part formed in a storage node contact extending the contact area connected electrically, thus increasing process stability.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For instance, the storage node may be formed of variously varied type and material and the number of manufacturing processes may be added or reduced. Accordingly, these and other changes and modifications are seen to be within the true spirit and scope of the invention as defined by the appended claims.

What is claimed is:

1. A method of forming a storage node of capacitor, the method comprising:
   sequentially forming a second interlayer insulation layer, an etching stop layer, and a mold layer on a semiconductor substrate, a lower structure of which includes a bit line pattern and a conductive region, said conductive region being formed in a first interlayer insulation layer to be connected with a capacitor storage node;
   partially etching the mold layer until a top surface of the etching stop layer is exposed;
   partially removing the exposed portion of the etching stop layer and also an upper portion of the second interlayer insulating layer, thereby forming a first aperture part that exposes a portion of the conductive region;
   etching the portion of the conductive region exposed in the first aperture part to form a second aperture part; and
   depositing a conductive layer on sidewalls of the first and second aperture parts to form the capacitor storage node.

2. The method of claim 1, wherein a lower face of the capacitor storage node is contacted with an upper part of the etched conductive region, with the etched conductive region being recessed adjacent an edge portion of the upper portion of the interlayer insulation layer.

3. The method as claimed in 1, wherein the mold layer is formed of a material having a high etch selection rate as compared with the etching stop layer.

4. The method as claimed in 3, wherein the mold layer is a PE-TEOS single layer or a multilayer containing a PE-TEOS layer.

5. The method as claimed in 1, wherein the etching stop layer comprises a silicon nitride layer.

6. The method as claimed in 1, wherein the semiconductor substrate has a capacitor storage node contact connected with the capacitor storage node.

7. The method as claimed in 6, wherein the capacitor storage node contact is formed of polysilicon.

8. The method as claimed in 1, wherein the conductive region is a capacitor storage node contact.

9. The method as claimed in 1, wherein the conductive region is in contact with a source region.

10. The method as claimed in 1, wherein etching of the mold layer comprises using a etch mask pattern that employs a polysilicon etch mask.

11. The method as claimed in 10, wherein the etch mask is etched at substantially the same time as the etching to form the second aperture part.

12. The method as claimed in 1, wherein the second aperture part is formed by determining an etch selection rate for the mold layer, the etching stop layer and by selectively etching only the conductive region.

13. The method as claimed in 12, wherein the etching of the conductive region to form the second aperture part is performed in a range of approximately 100 Å through approximately 3000 Å.

14. The method as claimed in 13, wherein the etching to form the second aperture part comprises dry etching.

15. The method as claimed in 1, wherein the capacitor storage node is a capacitor storage node for a DRAM cell.

16. The method as claimed in 1, wherein the conductive layer is formed of a material deposited by a chemical vapor deposition (CVD).

17. The method as claimed in 1, wherein the conductive layer is formed of amorphous silicon or polysilicon.

18. The method as claimed in 1, further comprising a process of performing a node separation of the capacitor storage node through a planarization process.

19. The method of claim 1, wherein the lower structure is formed by a straight structure.

20. A method of forming a storage node of a capacitor, the method comprising:
   forming a buffer layer on a semiconductor substrate, a lower structure of which includes a conductive region, said conductive region being formed in an interlayer insulation layer to be connected with a capacitor storage node;
   forming an etching stop layer on an upper surface of the buffer layer;
   forming a mold layer on an upper surface of the etching stop layer;
   partially etching the mold layer until a top surface of the etching stop layer is exposed, using an etch mask pattern;
   partially removing the exposed etching stop layer to expose a portion of the buffer layer;
   removing the exposed portion of the buffer layer and also an upper portion of the interlayer insulation layer, thereby forming a first aperture part that exposes a portion of the conductive region;
   partially etching the conductive region exposed in the first aperture part to form a second aperture part; and depositing a conductive layer on sidewalls of the first and second aperture parts to form the capacitor storage node.

21. The method as claimed in 20, wherein the mold layer has a high etch selection rate as compared with the etching stop layer.

22. The method as claimed in 21, wherein the mold layer is a PE-TEOS single layer or a multilayer containing a PE-TEOS layer.

23. The method as claimed in 21, wherein the etching stop layer comprises a silicon nitride layer.

24. The method as claimed in 20, wherein the buffer layer is formed of PE-TEOS material.

25. The method as claimed in 20, wherein the semiconductor substrate has a capacitor storage node contact connected with the capacitor storage node.

26. The method as claimed in 20, wherein the conductive region formed on the semiconductor substrate is a capacitor storage node contact.

27. The method as claimed in 25, wherein the capacitor storage node contact comprises polysilicon.

28. The method as claimed in 27, wherein the etch mask pattern employs an etch mask comprises polysilicon.

29. The method as claimed in 28, wherein the etch mask is etched at substantially the same time as when the etching is performed to form the second aperture part.

30. The method as claimed in 29, wherein the second aperture part is formed by determining an etch selection rate for the mold layer, the etching stop layer and by selectively etching only the conductive region.

31. The method as claimed in 30, wherein the etching of the conductive region to form the second aperture part is performed in a range of about 100 angstroms to about 3000 angstroms.

32. The method as claimed in 31, wherein the etching of the conductive region comprises dry etching.

33. The method as claimed in 20, wherein the conductive region is in contact with a source region provided in the lower structure of semiconductor substrate.

34. The method as claimed in 20, wherein the capacitor storage node is a capacitor storage node for a DRAM cell.

35. The method as claimed in 20, wherein the conductive layer is deposited by CVD.

36. The method as claimed in 20, wherein the conductive layer is formed of amorphous silicon or polysilicon.

37. The method as claimed in 20, further comprising the process of performing a node separation of the capacitor storage node through a planarization process.

38. The method of claim 20, wherein the lower structure is formed by a straight structure.

39. The method of claim 20, wherein the capacitor storage node is based on the square type.

40. The method as claimed in claim 1, wherein the etching of the mold layer employs a square type etch mask pattern overlapping with an upper portion of the conductive region.

41. The method of claim 1, wherein the second aperture part is etched to extend below an upper surface level of the bit line pattern.

42. The method of claim 20, wherein the second aperture part is etched to extend below an upper surface level of a bit line pattern.

* * * * *